United States Patent
Gunapala et al.

(10) Patent No.: US 7,737,411 B2
(45) Date of Patent: Jun. 15, 2010

(54) NBN AND PBP INFRARED DETECTORS WITH GRADED BARRIER LAYER, GRADED ABSORPTION LAYER, OR CHIRPED STRAINED LAYER SUPER LATTICE ABSORPTION LAYER

(75) Inventors: Sarath D. Gunapala, Stevenson Ranch, CA (US); David Z. Ting, Arcadia, CA (US); Cory J. Hill, Pasadena, CA (US); Sumith V. Bandara, Burke, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 12/249,749

(22) Filed: Oct. 10, 2008

(65) Prior Publication Data
US 2009/0127462 A1 May 21, 2009

Related U.S. Application Data

(60) Provisional application No. 60/998,494, filed on Oct. 11, 2007.

(51) Int. Cl.
H01L 27/14 (2006.01)
G01T 1/24 (2006.01)
(52) U.S. Cl. .............................. 250/370.12; 250/370.01
(58) Field of Classification Search ............ 250/370.12, 250/370.01
See application file for complete search history.

(56) References Cited

U.S. PATENT DOCUMENTS

2006/0056466 A1* 3/2006 Belenky et al. .............. 372/20
2007/0215900 A1* 9/2007 Maimon ..................... 257/184
2008/0111152 A1* 5/2008 Scott et al. .................. 257/188

OTHER PUBLICATIONS

Bishop, G. et al., "nBn detectors based on InAs/GaSb type-II strain layer superlattice", J. Vac. Sci. Technol. B 26(3), May/Jun. 2008, American Vacuum Society, (May 30, 2008), pp. 1145-1148.
Klipstein, Philip ""XBn" Barrier Photodetectors for High Sensitivity and High Operating Temperature Infrared Sensors", Infrared Technology and Applications XXXIV, edited by Bjorn F. Andresen, Gabor F. Fulop, Paul R. Norton, Proc. of SPIE vol. 6940, 69402U, (2008),12 pages.
Maimon, S. et al., "nBn detector, an infrared detector with reduced dark current and higher operating temperature", Applied Physics Letters 89, 151109, American Institute of Physics, (Oct. 10, 2006), 3 pages.

* cited by examiner

*Primary Examiner*—Constantine Hannaher

(57) ABSTRACT

An nBn detector is described where for some embodiments the barrier layer has a concentration gradient, for some embodiments the absorption layer has a concentration gradient, and for some embodiments the absorption layer is a chirped strained layer super lattice. The use of a graded barrier or absorption layer, or the use of a chirped strained layer super lattice for the absorption layer, allows for design of the energy bands so that the valence band may be aligned across the device. Other embodiments are described and claimed.

12 Claims, 4 Drawing Sheets

NBN AND PBP INFRARED DETECTORS WITH GRADED BARRIER LAYER, GRADED ABSORPTION LAYER, OR CHIRPED STRAINED LAYER SUPER LATTICE ABSORPTION LAYER

PRIORITY CLAIM

This application claims the benefit of U.S. Provisional Application No. 60/998,494, filed 11 Oct. 2007.

GOVERNMENT INTEREST

The invention claimed herein was made in the performance of work under a NASA contract, and is subject to the provisions of Public Law 96-517 (35 USC 202) in which the Contractor has elected to retain title.

FIELD

The present invention relates to infrared detectors, and more particularly, to nBn or pBp infrared detectors.

BACKGROUND

A new class of mid-wave infrared (MWIR) detector, termed an nBn detector, has recently been developed. See "nBn detector, an infrared detector with reduced dark current and higher operating temperature," S. Maimon and G. W. Wicks, *Applied Physics Letters* 89, 151109 (2006), hereinafter referred to as "Maimon". As described in Maimon, an nBn detector comprises an MWIR absorption n-type semiconductor, a large bandgap undoped barrier layer, and a second thin n-type layer. The barrier bandgap is larger than that of the absorption or contact layers. The thickness of the absorption n-type layer is about an optical absorption length or two. The barrier layer is thick enough so that there is negligible electronic tunneling through it, and the potential height of the barrier layer is such that there is negligible thermal excitation of majority carriers over it. The second n-type layer serves as a contact layer. In operation, metal contacts are applied to the n-type layers and a potential difference is applied to these metal contacts.

FIG. 1 illustrates a band diagram for the type of nBn detector described in Maimon. That part of the band diagram associated with the barrier is identified as such and is labeled with the letter "B", and that part of the band diagram associated with the two n-type layers are labeled with the letter "n", where the absorption layer is labeled as such and the other thin contact layer is labeled as such.

A potential difference is applied to metal contacts 102 and 104, where metal contact 102 is held at a positive potential with respect to that of metal contact 104. Illustrated in FIG. 1 are conduction band 106 and valence band 108. Pictorially illustrated in FIG. 1 is the generation of a hole-electron pair comprising hole 110 and electron 112 due to the absorption of a photon. Because of the potential difference between metal contact 102 and metal contact 114, electron 112 moves toward metal contact 102, and hole 110 moves toward metal contact 104. The current so generated by the absorption of infrared photons is sensed by an electronic circuit (not shown) coupled to the detector of FIG. 1.

The heterojunctions between the barrier layer and the two n-type layers are such that all of the bandgap difference appears in the conduction band offsets. That is, there is essentially zero offset in the valence band. This allows the barrier to block the flow of majority carrier current, while allowing the flow of minority carriers. As further described in Maimon, this type of structure significantly reduces dark current, e.g., Shockley-Reed-Hall (SRH) current and surface currents. When compared to many other types of photo diodes, this structure results in less noise, so that the nBn device may operate at a higher temperature with the same performance, or may provide better performance at the same temperature.

The requirement in Maimon of valence band alignment in the heterojunctions imposes a constraint on the type of alloy compositions used in the n-type layers and in the barrier layer. This requirement limits the device to only certain infrared wavelengths, e.g., 3.4 and 4.4μ cutoff wavelengths. Utilizing compositions that lead to a potential barrier on the valence band impedes the transport process of the minority carriers (holes) through the barrier layer. The resulting hole traps impede the minority carrier transport, which degrades the performance of the detector with regard to dark current reduction and operating temperature. This is illustrated in FIG. 2, where the upper part of the valence band in the barrier layer labeled 202 is for the case of Type II band alignment, and the lower part of the valence band labeled 204 is for the case of Type I band alignment. The potential barrier at the valence band impedes the minority hole transport. Furthermore, band-to-band tunneling may also take place.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
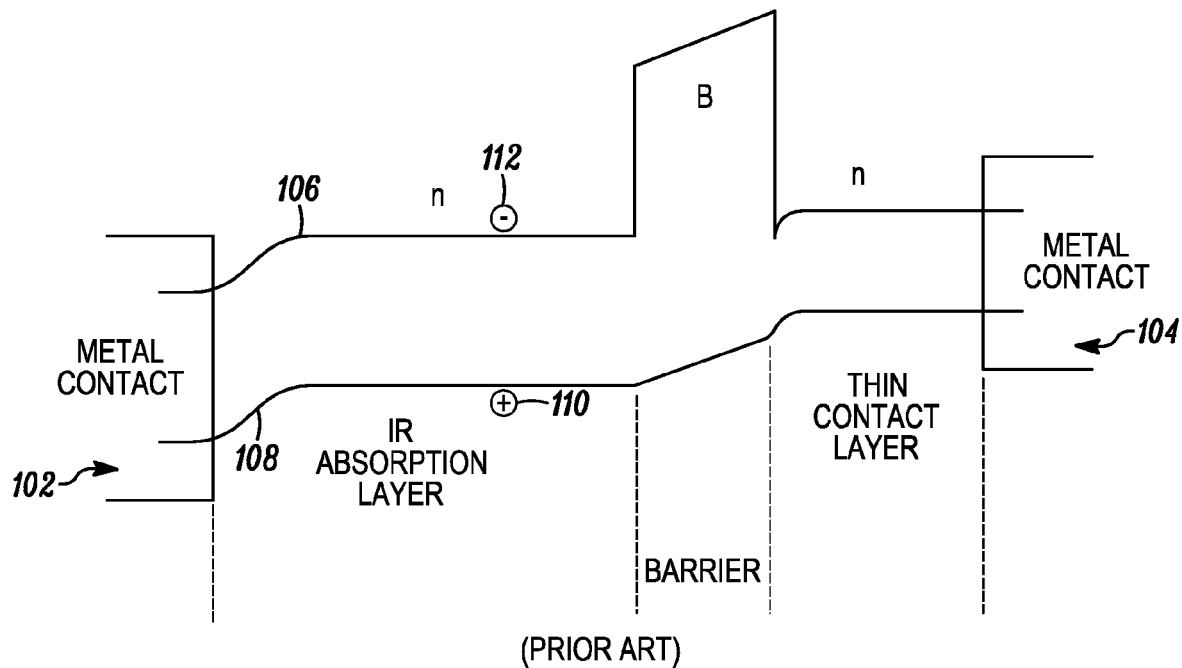
FIGS. 1 and 2 illustrate prior art bandgap diagrams for an nBn detector.
Figure 2:
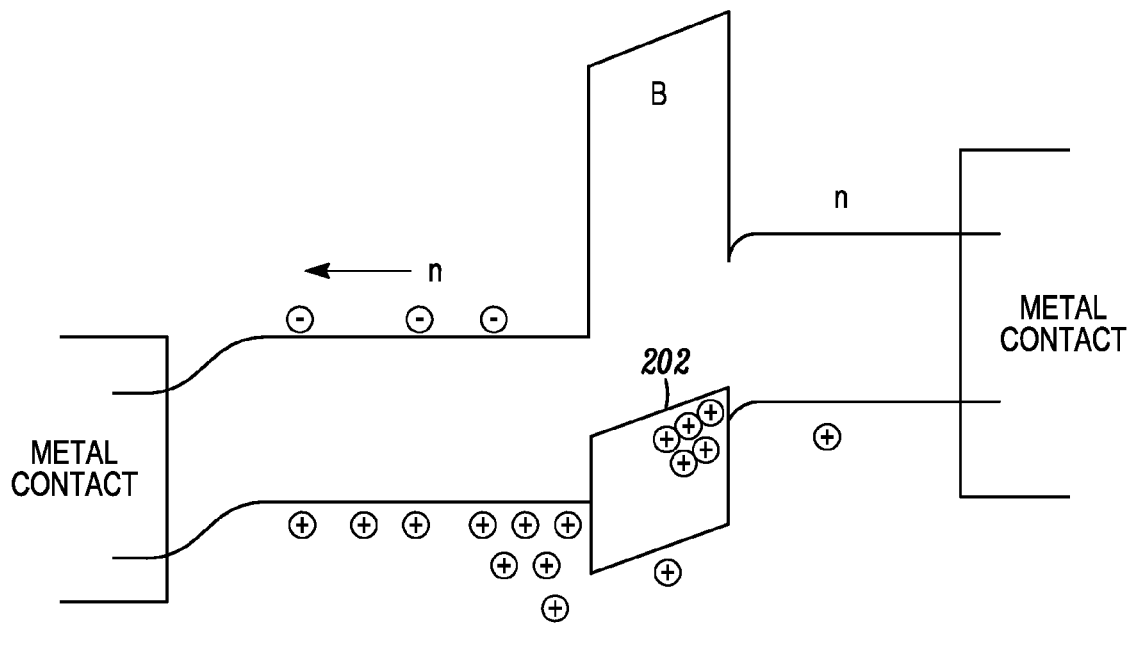
Figure 3A:
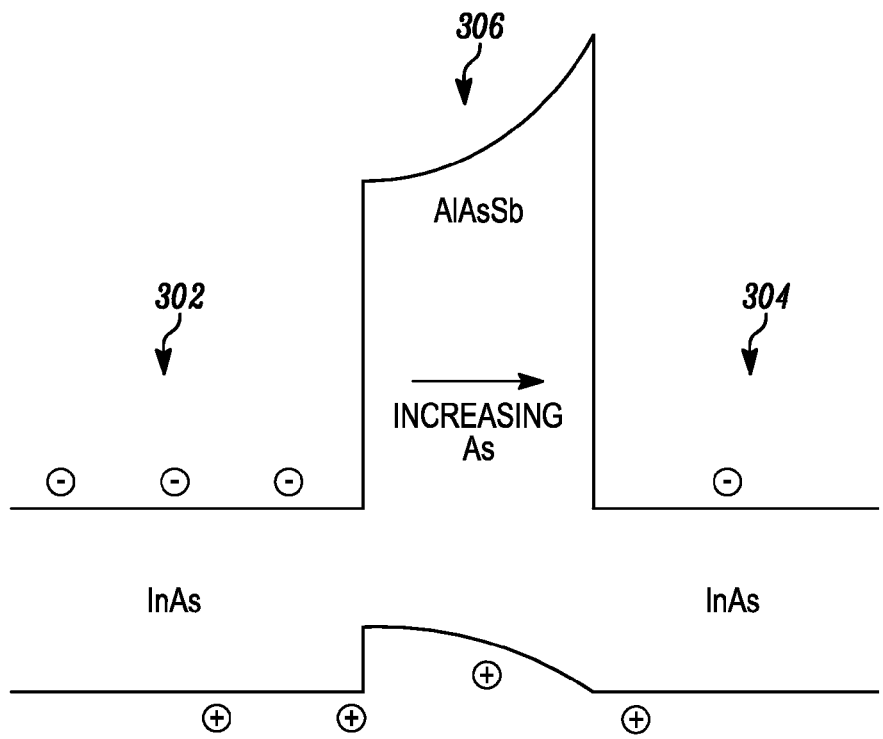
FIGS. 3A and 3B illustrate nBn detector embodiments in which the barrier layer has a concentration gradient.
Figure 3B:
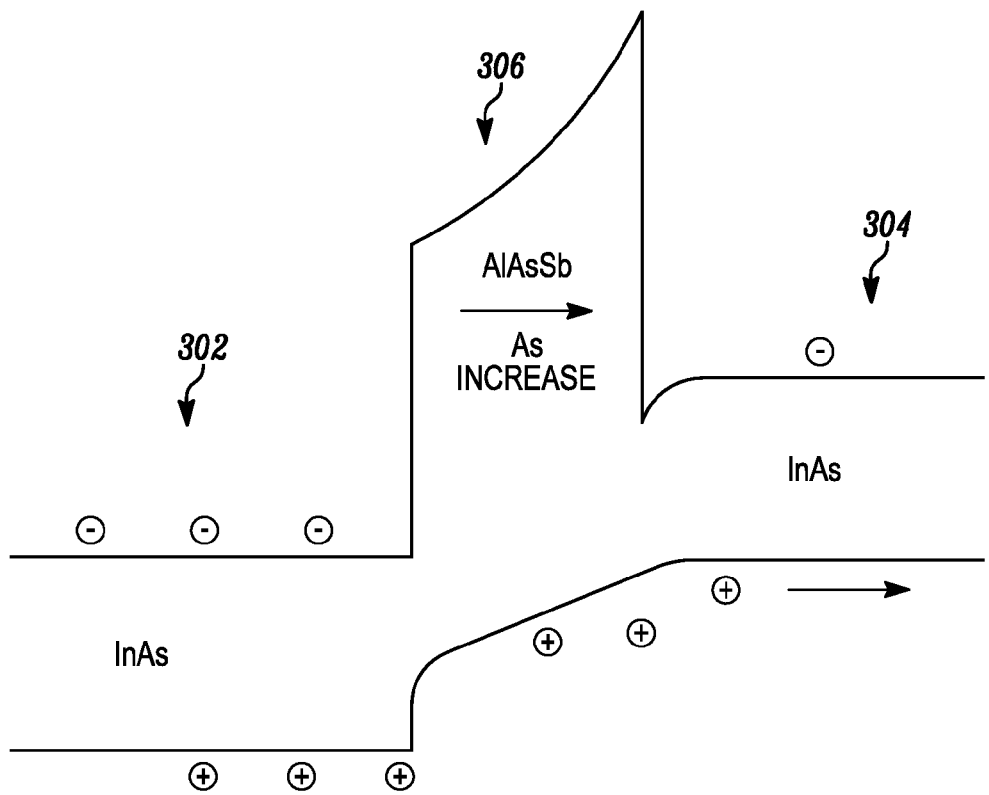

FIGS. 3A and 3B illustrate an nBn detector with Type II band alignment according to an embodiment, where in FIG. 3A no potential bias is applied to the detector, whereas in FIG. 3B a potential bias is applied, thereby causing changes to the shape of the band diagram. For each illustration in FIGS. 3A and 3B, the band structure for the absorption layer is to the left of each illustration, indicated by label 302, and the contact layer is to the right of each illustration, indicated by label 304, where the barrier layer is in between the absorption layer and the contact layer, indicated by label 306. The bandgap of the barrier layer is larger than that of the absorption layer and the contact layer.

In this particular embodiment, the absorption layer may comprise InAs and the contact layer may also comprise InAs. The barrier layer comprises an alloy of AlAsSb, where the Molar concentration of As increases as one moves from left to right in the illustration. For example, at the beginning of the barrier layer, at the junction with the absorption layer, the concentration of As may be zero, so that the alloy composition begins with AlSb. At the other side of the barrier next to the contact layer, the Molar concentration of As may be 10%. These concentration levels serve merely as an example, and other embodiments may employ different levels of As.

By increasing the Molar concentration of As in the barrier layer as one moves from the junction with the absorption layer to the junction with the contact layer, better matching of the valence band is achieved as indicated in FIG. 3B.

Figure 4A:
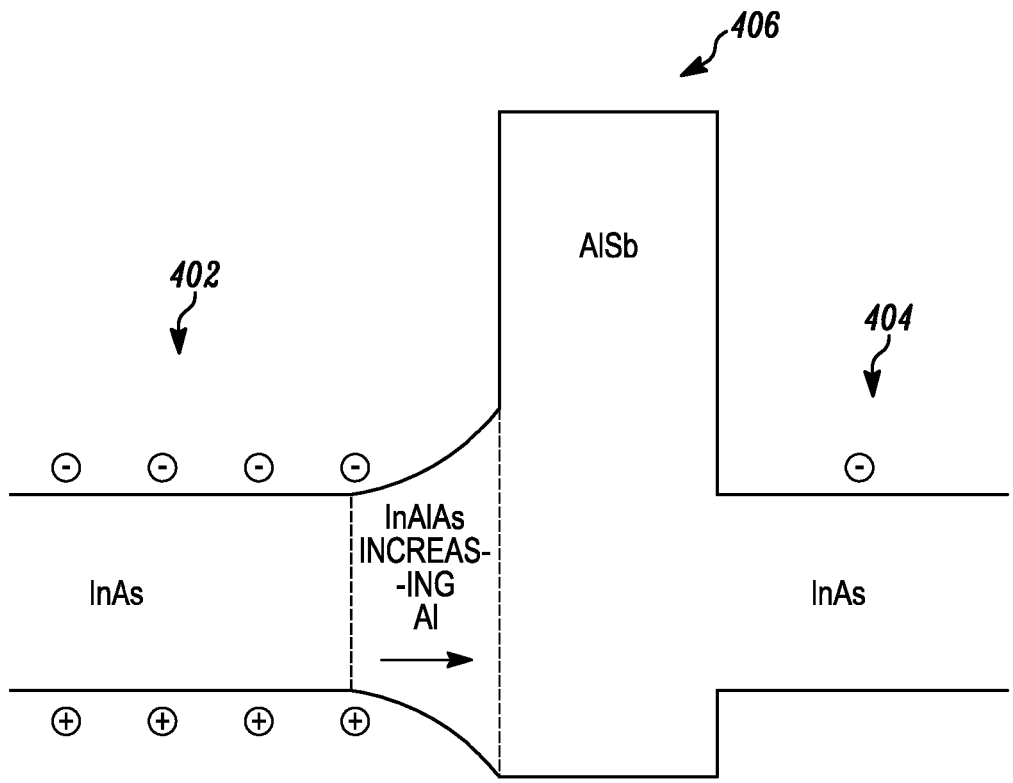
FIGS. 4A and 4B illustrate nBn detector embodiments in which the absorption layer has a concentration gradient.
Figure 4B:
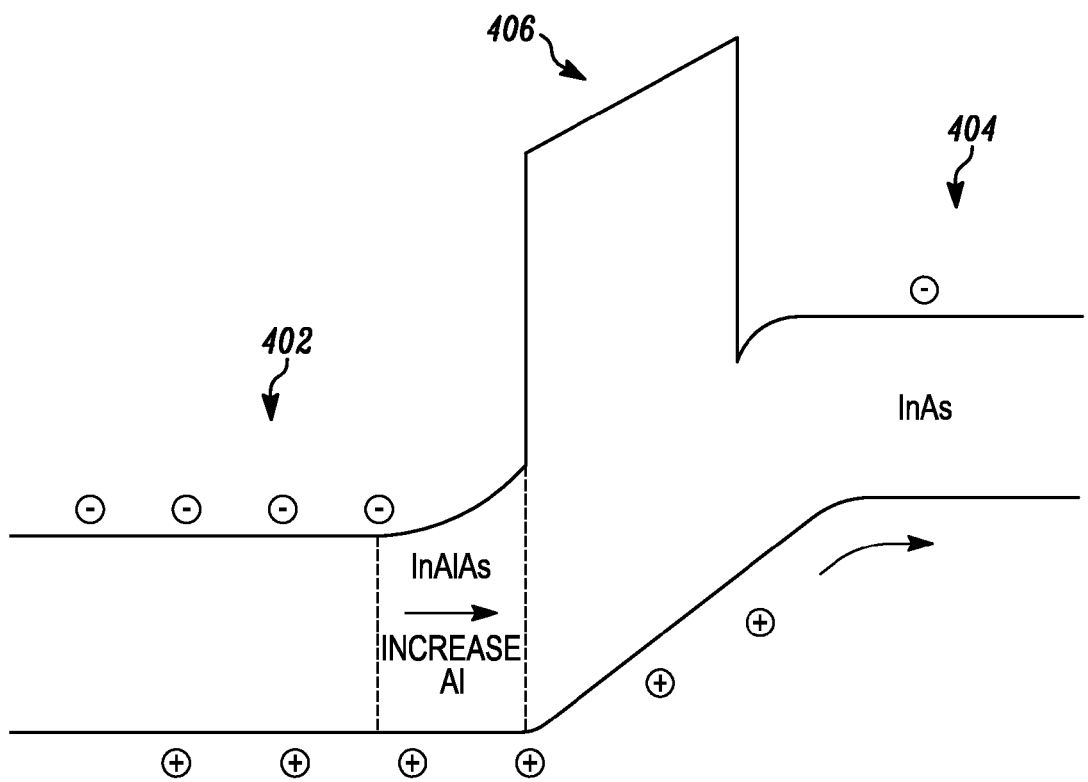

FIGS. 4A and 4B illustrate an nBn detector with Type I band alignment according to an embodiment, where in FIG. 4A no potential bias is applied to the detector, and where in FIG. 4B the potential bias is applied, causing changes to the shape of the band diagram. For each illustration in FIGS. 4A and 4B, the band structure for the absorption layer is to the left of each illustration, indicated by label 402, and the contact layer is to the right of each illustration, indicated by label 404, where the barrier layer is in between the absorption layer and the contact layer, indicated by label 406. As for the detector of FIGS. 3A and 3B, the bandgap of the barrier layer is larger than that of the absorption layer and the contact layer, and the absorption layer and the contact layer may each comprise InAs. The barrier layer comprises AlSb. In the particular embodiment of FIGS. 4A and 4B, in a region near the junction between the absorption layer and the barrier layer, the absorption layer also comprises InAlAs, where the Molar concentration of Al increases in a direction toward the barrier.

The distance over which the concentration of Al is increasing from zero to some final value may be on the order of 1000 Å, and for some embodiments the final Molar concentration of Al may be 10%. However, other embodiments may utilize different final concentration values for Al, and different concentration gradients. As seen in FIG. 4B, the concentration gradient for Al helps align the valence band.

Figure 5:
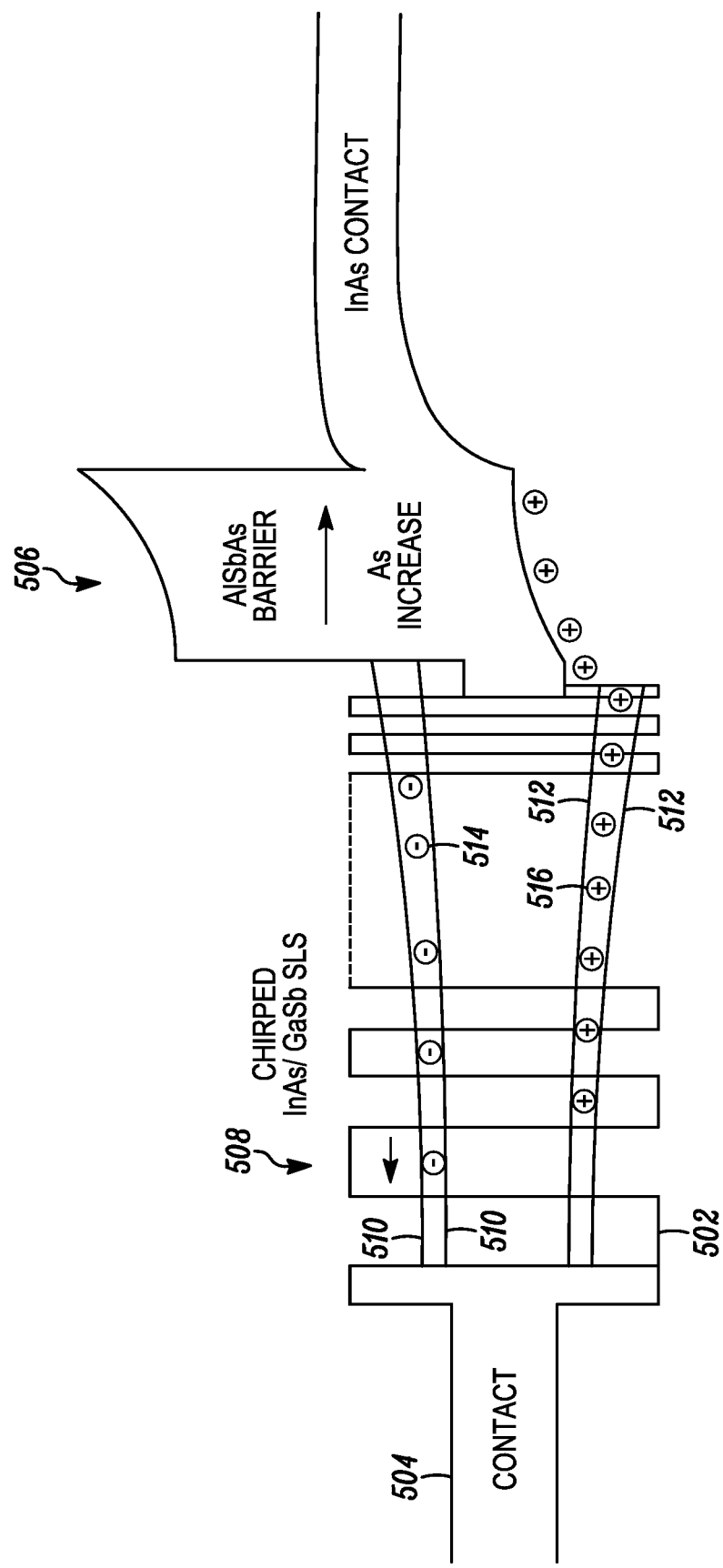
FIG. 5 illustrates an nBn detector according to an embodiment where the absorption layer comprises a chirped strained layer super lattice.

FIG. 5 illustrates an nBn detector according to another embodiment. The absorption layer is a chirped strained layer super lattice (SLS), and is labeled 508. In the particular embodiment of FIG. 5, the chirped SLS comprises alternating layers of the alloys InAs and GaSb, and is labeled as such. Other embodiments may employ different alloys for a chirped SLS. The periodicity of the alternating layers is pictorially represented by the waveform labeled 502. This waveform indicates the so-called chirped nature of the SLS absorption layer, where the thicknesses of the layers making up the SLS decreases in the direction from contact layer 504 to barrier layer 506.

For some embodiments, the length of the chirped SLS may be on the order of 1000 Å. As a particular example, the layers of the InAs/GaSb SLS may comprise multiple groups of alternating layers, where each group comprises three periods of alternating layers, where the thickness of each layer decreases by 5 Å from group to group, and where initially the thickness of the InAs layer is 40 Å and the thickness of the GaSb layer is 30 Å for the first group of 3 periods adjacent to contact 504. However, this is just one particular example, and clearly other embodiments may have different thicknesses and group sizes of alternating layers that make up the SLS.

The SLS absorption layer causes mini-bands, where the first conduction mini-band is indicated as that region of the energy diagram between the lines labeled 510, and the first valence mini-band is indicated as that region of the energy diagram between the lines labeled 512. Pictorially shown in FIG. 5 are electrons 514 in conduction mini-band 510, and holes 516 in valence mini-band 512. Proper choice of the layer dimensions and material making up the strained layer super lattice allows one to design the mini-bands so as to allow proper alignment of the valence mini-band with the valence band of barrier 506, and the chirped nature of the strained layer super lattice causes a built-in electric field to help minority carrier transport.

For ease of illustration, the conduction and valence bands for the individual layers making up the strained layer super lattice are not shown in FIG. 5, where only the first conduction mini-band and first valence mini-band are illustrated. Furthermore, the particular shape of the energy band diagram depends upon whether the device has a Type I band alignment, a Type II broken gap band alignment, or a Type II staggered gap band alignment. However, the shape of the energy band diagram in FIG. 5 is sufficient to illustrate the components making up the embodiment.

Various modifications may be made to the described embodiments without departing from the scope of the invention as claimed below. For example, some embodiments may have a barrier layer with a concentration gradient as discussed with respect to the embodiment of FIG. 3A, and also have a chirped strained layer super lattice for the absorption layer as discussed with respect to an embodiment of FIG. 5. Furthermore, some embodiments may be a pBp detector, where instead of an n-type semiconductor for the absorption and contact layers, a p-type semiconductor is used. For such a pBp detector, the design goal of the concentration gradient in the barrier or absorption layers, and the design goal of the chirped strained layer super lattice for the absorption layer, is to allow alignment of the conduction band (or conduction mini-band for the case of using the chirped SLS) across the device to facilitate minority carrier transport. In the case of a pBp detector, the minority carriers are electrons.

What is claimed is:

1. A detector comprising:
    an absorption layer for generating electrons-hole pairs in response to absorbed photons, the absorption layer comprising a semiconductor having majority carriers and minority carriers;
    a barrier layer comprising a semiconductor adjacent to the absorption layer to provide a barrier to the majority carriers, the barrier layer comprising a concentration gradient; and
    a contact layer comprising a semiconductor adjacent to the barrier layer.

2. The detector as set forth in claim 1, wherein the absorption layer and the contact layer are n-type semiconductors so that the majority carriers are electrons and the minority carriers are holes.

3. The detector as set forth in claim 2, the barrier layer comprising As and having a concentration gradient in As so that the concentration of As increases in a direction from the absorption layer to the contact layer.

4. The detector as set forth in claim 3, the barrier layer comprising AlAsSb.

5. The detector as set forth in claim 4, the absorption layer and the contact layer comprising InAs.

6. The detector as set forth in claim 1, the absorption layer, the barrier layer, and the contact layer each having a band for conduction of the minority carriers, the concentration gradient such that the band is aligned across the barrier layer and the contact layer.

7. A detector comprising:
    an absorption layer for generating electrons-hole pairs in response to absorbed photons, the absorption layer comprising a semiconductor having majority carriers and minority carriers, the absorption layer comprising a chirped strained layer super lattice to generate electron-hole pairs in response to the absorbed photons;
    a barrier layer comprising a semiconductor adjacent to the absorption layer to provide a barrier to the majority carriers; and
    a contact layer comprising a semiconductor adjacent to the barrier layer.

8. The detector as set forth in claim 7, wherein the absorption layer and the contact layer are n-type semiconductors so that the majority carriers are electrons and the minority carriers are holes.

9. The detector as set forth in claim 8, the absorption layer comprising InAs and GaSb layers to form the chirped strained layer super lattice, the chirped strained layer super lattice comprising groups of InAs and GaSb layers where each group comprises a plurality of alternating layers of InAs and GaSb, wherein the thicknesses of the InAs and GaSb layers decrease from group to group along a direction toward the barrier layer.

10. The detector as set forth in claim 9, the barrier layer comprising AlSbAs.

11. The detector as set forth in claim 10, the contact layer comprising InAs.

12. The detector as set forth in claim 7, the absorption layer, the barrier layer, and the contact layer each having a band for conduction of the minority carriers, where the thicknesses of the InAs and GaSb are such that the band is aligned across the barrier layer and the contact layer.

* * * * *